(12) United States Patent
Roth

(10) Patent No.: US 7,279,900 B2
(45) Date of Patent: Oct. 9, 2007

(54) MAGNETIC RESONANCE APPARATUS WITH PRESSURE RESERVOIR

(75) Inventor: Gerhard Roth, Rheinstetten (DE)

(73) Assignee: Bruker Biospin GmbH, Rheinstetten (DE)

( * ) Notice: Subject to any disclaimer, the term of this patent is extended or adjusted under 35 U.S.C. 154(b) by 0 days.

(21) Appl. No.: 11/488,765

(22) Filed: Jul. 19, 2006

(65) Prior Publication Data

US 2007/0024284 A1 Feb. 1, 2007

(30) Foreign Application Priority Data

Jul. 30, 2005 (DE) ...................... 10 2005 035 892

(51) Int. Cl.
*G01V 3/00* (2006.01)

(52) U.S. Cl. ...................... 324/318; 324/319

(58) Field of Classification Search ........ 324/300–322; 600/410–449; 62/51, 6, 3
See application file for complete search history.

(56) References Cited

U.S. PATENT DOCUMENTS

| 5,735,127 | A | | 4/1998 | Pfotenhauer | |
|---|---|---|---|---|---|
| 5,744,959 | A | * | 4/1998 | Jeker et al. | 324/319 |
| 6,065,295 | A | * | 5/2000 | Hafner et al. | 62/6 |
| 6,828,889 | B1 | * | 12/2004 | Zaput | 335/216 |
| 6,996,993 | B2 | * | 2/2006 | Crowley | 62/6 |

| 2004/0107705 | A1 | 6/2004 | Crowley |
|---|---|---|---|

FOREIGN PATENT DOCUMENTS

| DE | 55 680 | 5/1967 |
|---|---|---|
| GB | 1 084 736 | 9/1967 |
| GB | 2 391 926 | 2/2004 |
| JP | 07 035 427 | 2/1995 |
| JP | 08 014 678 | 1/1996 |

OTHER PUBLICATIONS

Takayuki, Tomaru et al. "Vibration analysis of cryocoolers". Cryogenics 44 (2004) 309-317.

* cited by examiner

*Primary Examiner*—Brij B. Shrivastav
(74) *Attorney, Agent, or Firm*—Paul Vincent

(57) ABSTRACT

A magnetic resonance apparatus comprising a superconducting magnet coil which is disposed in a cryostat, and a refrigerator for cooling the magnet coil, which comprises a compressor for compressing a working gas, and a high-pressure line and a low-pressure line between the compressor and a control valve, which periodically connects the high-pressure line and the low-pressure line to a connecting line from the control valve to a cold head of the refrigerator, thereby generating pressure pulses via the connected working gas, wherein the control valve is mechanically rigidly connected to the cryostat, is characterized in that one pressure reservoir is provided in the high-pressure line and/or in the low pressure line, which is mechanically rigidly connected to the cryostat and which is connected to the compressor via a mechanically flexible line section. This permits supply of a working gas to a cold head using a compressor in such a manner that the artifacts in the NMR signals caused by the pressure pulses of the working gas are minimized.

8 Claims, 2 Drawing Sheets

MAGNETIC RESONANCE APPARATUS
WITH PRESSURE RESERVOIR

This application claims Paris Convention priority of DE 10 2005 035 892.6 filed Jul. 30, 2005 the complete disclosure of which is hereby incorporated by reference.

BACKGROUND OF THE INVENTION

The invention concerns a magnetic resonance apparatus with a superconducting magnet coil which is disposed in a cryostat, and a refrigerator for cooling the magnet coil, which comprises a compressor for compressing a working gas, a high-pressure line and a low-pressure line between the compressor and a control valve that periodically connects the high-pressure line and the low-pressure line to a connecting line between the control valve and a cold head of the refrigerator, thereby generating pressure pulses through the switched working gas, wherein the control valve is mechanically rigidly connected to the cryostat.

A configuration of this type is disclosed by T. Tomaru et al. in Cryogenics 44, pages 309-317 (2004). The compressor is disposed outside of the cryostat and connected to the control valve via the high-pressure or low-pressure line. In order to reduce transmission of vibrations from the surroundings to the cryostat, in particular, to decouple the cryostat from the compressor, the high-pressure line and the low-pressure line are designed as flexible hoses through which a working gas is guided from the compressor to the control valve and finally to the cold head of the refrigerator. However, the vibrations of the pressure wave of the working gas within the lines cause the flexible conduit hoses to vibrate and transmit these vibrations to the control valve and therefore also to the cryostat. The vibrations may produce artifacts in the NMR signals.

It is therefore the underlying purpose of the invention to propose a magnetic resonance apparatus which supplies a working gas to a cold head using a compressor, such that the artifacts in the NMR signals caused by the above-described vibrations are minimized.

SUMMARY OF THE INVENTION

This object is achieved in accordance with the invention in that one pressure reservoir is provided in the high-pressure line and/or low-pressure line, which is mechanically rigidly connected to the cryostat and which is connected to the compressor via a mechanically flexible line section.

The compressor is therefore not directly connected to the control valve via the high-pressure and/or low-pressure line. The pressure reservoir serves as a buffer container from which the refrigerator is fed. The oscillating amplitude of the pressure pulses of the working gases from the compressor to the pressure reservoir can be minimized due to the additional volume of the pressure reservoir, wherein the refrigerator can be simultaneously fed with pressure pulses with the same amplitude. This permits unobstructed operation of the refrigerator. The motion of the high-pressure and/or low-pressure line and therefore transmission of vibrations to the cryostat can be considerably reduced by filling the pressure reservoir using pressure pulses of small amplitude.

The cryostat and the magnet coil are preferably isolated with respect to vibrations from the surroundings. This prevents transmission of vibrations from the surroundings.

In a preferred embodiment of the inventive magnetic resonance apparatus, the pressure reservoir is connected to the control valve via a mechanically rigid line section in order to prevent introduction of further vibrations from moving conduit hoses.

With particular preference, the volume of the pressure reservoir is selected such that the pressure fluctuations in the high-pressure line and/or low-pressure line are minimized upstream of the pressure reservoir on the compressor side. This also minimizes transmission of vibrations from the compressor to the reservoir and the components rigidly connected thereto.

Towards this end, the volume of the pressure reservoir is preferably x times the volume of the high-pressure line or low-pressure line, wherein 1<x<100, preferably 5<x<10.

In a preferred embodiment of the inventive magnetic resonance apparatus, the control valve is a rotary valve.

With particular preference, the refrigerator is a pulse tube cooler, since pulse tube coolers can be operated with particularly low vibration.

The inventive magnetic resonance apparatus is preferably designed for high-resolution NMR measurements. These measurements require high vibration decoupling and for this reason, the properties of the invention can be utilized with particular advantage.

The use of the pressure reservoir in the high-pressure and/or low-pressure line of the inventive magnetic resonance apparatus can improve the pressure fluctuations from the compressor to the pressure reservoir and thereby the transmission of vibrations to the cryostat, thereby improving the MR measurement quality.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

DESCRIPTION OF THE PREFERRED EMBODIMENT

Figure 2:
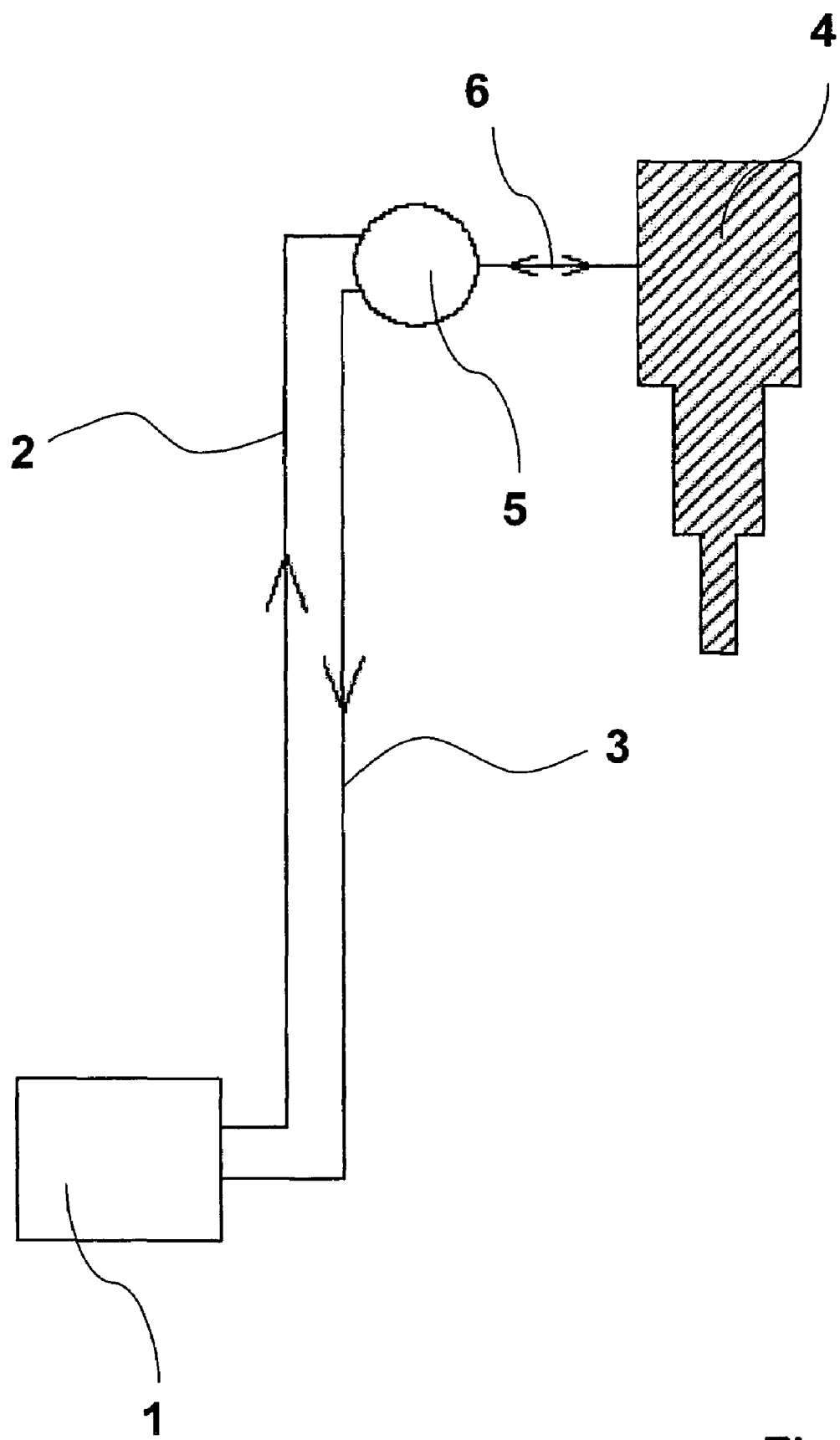
FIG. 2 shows a conventional refrigerator of a magnetic resonance apparatus.

FIG. 2 shows a refrigerator of a magnetic resonance apparatus according to prior art. A compressor 1 supplies or discharges a working gas to/from a cold head 4 of the refrigerator via a high-pressure lie 2 and a low-pressure line 3. The supply of the working gas is controlled by a control valve 5 which alternately connects high pressure and low pressure to the cold head 4 via a connecting line 6 which opens into the cold head 4. The magnet coil, cryostat, cold head 4 and control valve 5 are thereby rigidly connected to each other to form a system which is isolated with respect to vibrations from the surroundings. For this reason, vibrations introduced in the control valve 5 e.g. due to pressure waves of the working gas or from the surroundings also have an effect on the magnet coil and therefore also on measurements produced with this magnet coil.

In order to prevent or at least reduce transmission of vibrations of the pressure wave of the working gas, the inventive magnetic resonance apparatus has at least one pressure reservoir 7, 8 in the high-pressure line 2 and/or the low-pressure line 3.

Figure 1:
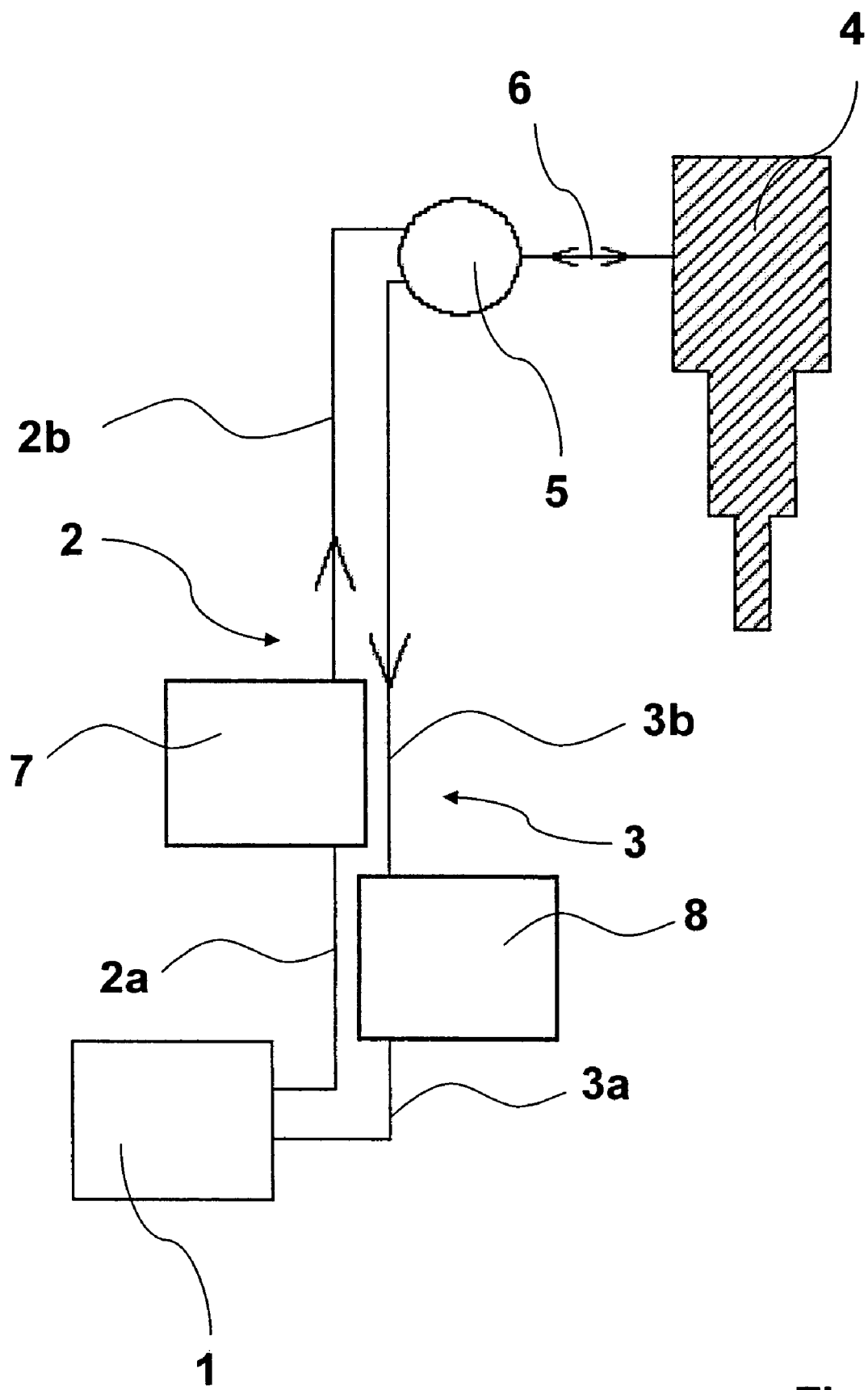
FIG. 1 shows a refrigerator of an inventive magnetic resonance apparatus with pressure reservoir in the high-pressure and low-pressure line.

FIG. 1 shows one embodiment, wherein a pressure reservoir 7 is disposed in the high-pressure line 2 and a pressure reservoir 8 is disposed in the low pressure line 3 between the compressor 1 and the control valve 5, such that the high-pressure line 2 is divided into two line sections 2a, 2b and the low-pressure line 3 is divided into two line sections 3a, 3b. The line sections 2a, 3a which extend between the compressor 1 and the pressure reservoirs 7, 8 are flexible in order to prevent or at least minimize transmission of vibrations from the surroundings to the pressure reservoir and the cryostat. The configuration of the pressure reservoirs 7, 8 additionally prevents transmission of vibrations to the cryostat due to movement of the flexible line sections 2a, 3a, since the working gas can be supplied to or discharged from the pressure reservoir through pressure impacts of smaller amplitude than would be possible with direct supply of the working gas to the control valve 5. The working gas can be supplied to or discharged from the control valve 5 and therefore also to or from the cold head 4 of the refrigerator via the reservoirs 7, 8, still using pressure pulses with the same amplitude as in prior art, such that the refrigerator can be operated with the same power as conventional configurations. The pressure reservoirs 7, 8 may also be designed as line sections with correspondingly large line cross-sections compared to the line cross-sections of the line sections 2b, 3b adjacent to the control valve 5.

The pressure reservoirs 7, 8 and the control valve 5 are coupled to the cryostat such that they are fixed relative to the oscillating frequencies transmitted by the working gas, and are therefore part of the system which is isolated with respect to vibrations from the surroundings, but may oscillate relative to the surroundings, wherein the components of the system are rigidly connected to each other. The line sections 2b, 3b between the pressure reservoirs 7, 8 and the control valve 5 may therefore be rigid without transmitting further vibrations to the overall system.

LIST OF REFERENCE NUMERALS

1 compressor
2 high-pressure line
2a flexible line section of the high-pressure line
2b rigid line section of the high-pressure line
3 low-pressure line
3a flexible line section of the low-pressure line
3b rigid line section of the low-pressure line
4 cold head
5 control valve
6 connecting line
7 pressure reservoir
8 pressure reservoir

I claim:

1. A magnetic resonance apparatus having a superconducting magnet coil disposed in a cryostat, the apparatus comprising:
    a refrigerator cold head for cooling the magnet coil;
    a control valve for periodically supplying a working gas to said cold head, said control valve being rigidly mechanically connected to the cryostat;
    a compressor for compressing the working gas;
    a high-pressure line disposed between and connecting said compressor and said control valve to pass the working gas;
    a low-pressure line disposed between and connecting said control valve and said compressor to pass the working gas;
    a supply line disposed between and connecting said control valve and said cold head to periodically pass the working gas, thereby generating pressure pulses in the working gas; and
    at least one pressure reservoir disposed in at least one of said high-pressure line and said low-pressure line, said at least one pressure reservoir being mechanically rigidly connected to the cryostat and being connected to said compressor via a mechanically flexible line section.

2. The magnetic resonance apparatus of claim 1, further comprising means for isolating the cryostat and the magnet coil with respect to ambient vibrations.

3. The magnetic resonance apparatus of claim 1, wherein said at least one pressure reservoir is connected to said control valve via a mechanically rigid line section.

4. The magnetic resonance apparatus of claim 1, wherein a volume of said pressure reservoir is selected such that pressure fluctuations in said high-pressure line and/or low-pressure line are minimized on a compressor side, upstream of said pressure reservoir.

5. The magnetic resonance apparatus of claim 4, wherein a volume of said pressure reservoir is x times a volume of said high-pressure line or of said low-pressure line, wherein $1<x<100$ or $5<x<10$.

6. The magnetic resonance apparatus of claim 1, wherein said control valve is a rotary valve.

7. The magnetic resonance apparatus of claim 1, wherein said cold head is part of a pulse tube cooler.

8. The magnetic resonance apparatus of claim 1, wherein the apparatus is structured for high-resolution NMR measurements.

* * * * *